United States Patent [19]

Cathey, Jr.

[11] Patent Number: 5,354,698
[45] Date of Patent: Oct. 11, 1994

[54] HYDROGEN REDUCTION METHOD FOR REMOVING CONTAMINANTS IN A SEMICONDUCTOR ION IMPLANTATION PROCESS

[75] Inventor: David A. Cathey, Jr., Boise, Id.
[73] Assignee: Micron Technology, Inc., Boise, Id.
[21] Appl. No.: 93,424
[22] Filed: Jul. 19, 1993
[51] Int. Cl.$^5$ .......................................... H01L 21/265
[52] U.S. Cl. ...................................... 437/20; 437/937; 437/939
[58] Field of Search .................. 437/15, 20, 937, 939, 437/946, 949; 148/DIG. 17, DIG. 22, DIG. 79

[56] References Cited

U.S. PATENT DOCUMENTS

| | | | |
|---|---|---|---|
| 3,506,508 | 4/1970 | Nickl | 437/939 |
| 4,331,486 | 5/1982 | Chenevos-Paule et al. | 437/937 |
| 4,477,311 | 10/1984 | Mimura et al. | 156/643 |
| 4,595,453 | 6/1987 | Yamazaki et al. | 56/643 |
| 4,698,104 | 10/1987 | Barker et al. | 437/141 |
| 4,706,870 | 11/1987 | Legge | 228/123 |
| 4,849,375 | 7/1989 | Gluck et al. | 148/DIG. 17 |
| 4,923,828 | 5/1990 | Gluck et al. | 148/DIG. 17 |
| 5,007,232 | 4/1991 | Caudill et al. | 53/426 |
| 5,068,007 | 11/1991 | Rogers et al. | 156/643 |
| 5,089,441 | 2/1992 | Moslehi | 437/937 |

FOREIGN PATENT DOCUMENTS 4-107921  4/1992  Japan ................................. 437/937

OTHER PUBLICATIONS

Steiner et al., "Process and Module For Low Temperature Hydrogen Cleaning of Silicon Wafer", Journal Electrochemical Society Proceedings, vol. (unknown) pp. 254-264, 1992.
Clark et al., "Surface Modification of InP By Plasma Techniques Using Hydrogen and Oxygen", Electronics and Optics, Thin Solids Films 78 (1981) pp. 271-278.
Veprek et al., "The Preparation of Thin Layers of Ge and Si By Chemical Hydrogen Plasma Transport", Solid-State Electronics, Pergamon Press, 1968, vol. 11, pp. 683-684.
Chang et al., "Hydrogen Plasma Etching of GaAs Oxide", Appl. Phys Lett. 38(11), American Institute of Physics, 1981, pp. 898-900.
Webb et al., "Reactivity of Solid Silicon With Hydrogen Under Conditions Of A Low Pressure Plasma", Chemical Physics Letters, vol. 62, No. 1, (Mar. 1979), pp. 173-177.
Veprek et al., "Transport of Phosphorus in a Low Pressure Hydrogen Plasma", Z. anorg. allg. Chemie 415, 190-192 (1975), pp. 190-192.
Ghandhi, S. K., "VLSI Fabrication Principles", pp. 300-301, 337-339.

*Primary Examiner*—Tom Thomas
*Assistant Examiner*—Chandra Chaudhari
*Attorney, Agent, or Firm*—Stephen A. Gratton

[57] ABSTRACT

In semiconductor manufacture a method of ion implanting a substrate includes an in-situ hydrogen reduction for removing or outgassing contaminants present on the surface of the substrate. By removing the contaminants, the implantation of "knock ons" into the crystal lattice structure of the substrate is prevented. In an illustrative embodiment of the invention, the hydrogen reduction is performed using a low-temperature, high-energy hydrogen plasma. The method of the invention can be used to remove contaminants such as carbon, carbon dioxide, oxygen, sulfur, phosphorus, boron, $H_2O$ and native oxides present on the surface to be implanted.

19 Claims, 1 Drawing Sheet

HYDROGEN REDUCTION METHOD FOR REMOVING CONTAMINANTS IN A SEMICONDUCTOR ION IMPLANTATION PROCESS

FIELD OF THE INVENTION

This invention relates to semiconductor manufacture and more particularly to a novel in-situ hydrogen reduction method for removing contaminants and preventing "knock ons" in an ion implantation process.

BACKGROUND OF THE INVENTION

In the formation of integrated circuit devices (ICs), a semiconducting substrate (e.g. silicon) is subjected to a series of chemical and thermal process steps to modify the electrical properties of certain areas of the substrate. Doping is the process of placing specific amounts of dopant atoms into the crystal lattice structure of the substrate or into a film deposited on the substrate.

In general, the electrical characteristics (e.g. conductivity, resistivity) of a defined region of a semiconductor structure are a function of the concentration and depth of the dopants in that region. Common dopants for silicon include phosphorous, boron and arsenic. In order to obtain semiconductor devices having predictable and reliable electrical characteristics, a doping process must be controlled to provide an optimal concentration and depth for the dopant atoms. In addition, the doping process must ensure that contaminants such as oxygen, carbon, $H_2O$ and others are not introduced into the semiconductor devices during the doping process.

One technique for doping a semiconducting substrate is known as ion implantation. Ion implantation can be used to precisely control the number of implanted dopant atoms and their depth distribution profile within a semiconducting substrate. Following ion implantation a thermal annealing step is performed. The annealing step further drives the dopants into the crystal lattice.

With ion implantation the implanted ions are ionized atoms of the dopants. Ionization typically occurs in a process chamber that is fed by source vapors. The process chamber is maintained at a reduced atmospheric pressure or vacuum. Inside the process chamber is a filament that is heated to the point where electrons are created from the filament surface. The negatively charged electrons are attracted to an oppositely charged anode in the chamber. During the travel from the filament to the anode, the electrons collide with the dopant source molecules and create positively charged ions from the elements in the molecule. These ions are then accelerated to a high velocity and directed at a target semiconductor wafer. The ions possess enough energy to penetrate the surface of the wafer.

One problem associated with the use of ion implantation in the manufacture of integrated circuits is contaminants introduced into the crystal lattice structure of the substrate during the ion implantation process. These implanted contaminants are sometimes referred to as "knock ons". Typically, "knock ons" originate as contaminants such as adsorbed oxygen, carbon, carbon dioxide, $H_2O$ atoms and native oxide layers ($SiO_2$) present on the surface of the substrate to be implanted. During the ion implantation process these atoms are implanted into the crystal lattice structure of a substrate by impinging implant ions.

This is a problem because the presence of "knock ons" in the crystal lattice of a semiconducting substrate, adversely affects the completed semiconductor devices. As an example, the "knock ons" damage and contaminate the crystal lattice and may cause current leakage and undesirable electrical characteristics in the implanted substrate. This is a particular problem in the formation of high density integrated circuits. AS an example, during the arsenic implantation of silicon, it is very easy to introduce "knock ons" into the crystal lattice. Moreover, this problem is compounded by the increased use of new MEV implantation methods in the production of DRAMS.

In view of the foregoing, there is a need in the art for improved ion implantation methods. The present invention is directed to an improved method of ion implantation and particularly to an improved method for removing contaminants in-situ during ion implantation.

Accordingly, it is an object of the present invention to provide an improved ion implantation method in which contaminants are removed in-situ prior to implantation of the dopants. It is another object of the present invention to provide an improved ion implantation method which uses a hydrogen reduction to remove contaminants from the surface of a substrate to be implanted to prevent the implantation of "knock ons" into the crystal lattice structure of the substrate. It is a further object of the present invention to provide an improved ion implantation method that is suitable for large scale semiconductor manufacture.

SUMMARY OF THE INVENTION

In accordance with the method of the invention, an improved method of ion implantation is provided. The method of the invention, simply stated, comprises an in-situ hydrogen reduction during the ion implantation process to remove contaminants from the surface of a substrate, such as a silicon wafer, to be implanted. A high temperature hydrogen gas or a low pressure ionized hydrogen plasma is applied in a reduction chamber to the substrate to be implanted prior to the ion implantation step. The hydrogen gas or plasma reduces the contaminants on the surface of the substrate to form volatile compounds. In addition, the hydrogen gas or plasma imparts sufficient energy to some existing compounds on the substrate such as $H_2O$ to effect their release or outgas from the wafer surface. These volatile and released compounds diffuse into the reduction chamber and are then pumped from the reduction chamber. In order to avoid the introduction of additional contaminants, the cleaned substrate is then maintained under a vacuum or an inert environment throughout the remainder of the implant process.

The method of the invention can be used to effectively remove contaminants such as carbon, carbon dioxide, oxygen, sulfur, phosphorus, boron, $H_2O$, native oxides and others from the surface of a substrate to be implanted. This prevents the subsequent implantation of these contaminants and the formation of "knock ons" during the implantation process.

The method of the invention, generally stated, includes the steps of: loading a substrate into a reduction chamber; maintaining the reduction chamber under a vacuum; directing a high temperature hydrogen gas or a low temperature hydrogen plasma at the substrate to reduce and release contaminants from the surface of the substrate; maintaining the substrate under vacuum or an inert environment; and then ion implanting the substrate with selected ion dopants.

Other objects, advantages and capabilities of the present invention will become more apparent as the description proceeds.

DETAILED DESCRIPTION OF THE PREFERRED EMBODIMENT

Figure 1:
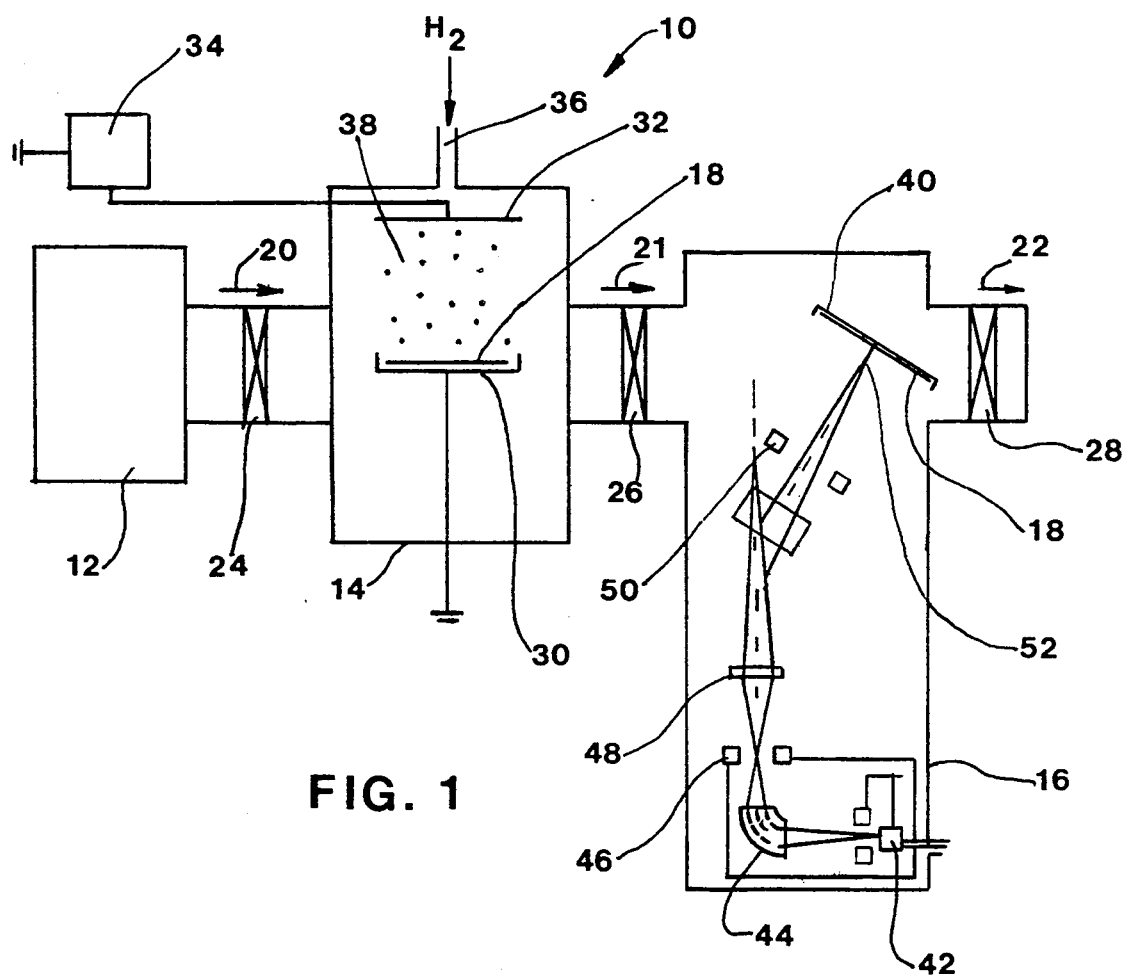
FIG. 1 is a schematic view of an ion implantation system suitable for performing an in-situ hydrogen reduction and ion implantation of a substrate in accordance with the method of the invention.

The method of the invention, broadly stated, comprises an in-situ hydrogen reduction during an ion implantation process to remove contaminants and thin oxide layers from the surface of a substrate and to prevent the formation of "knock ons". The hydrogen reduction can be accomplished using a high temperature hydrogen gas or a hydrogen plasma. A system for performing the method of the invention must be closed so that following hydrogen reduction the substrate remains free of contaminants.

Referring now to FIG. 1, a closed ion implant system 10 for ion implanting semiconductor wafers in accordance with the method of the invention is shown. The ion implant system 10 includes a load lock chamber 12, a hydrogen reduction chamber 14, and an ion implanter 16. A semiconductor wafer 18 is moved through the system 10 from the load lock chamber 12, to the hydrogen reduction chamber 14, and then to the ion implanter 16 without exposure to ambient. Directional arrows 20, 21, 22 indicate the direction of movement of a semiconductor wafer 18 through the ion implant system 10. Sealed transport channels 24, 26, 28 are provided for moving the wafer 18 through the ion implant system 10.

The entire system 10 can be maintained under a vacuum by a suitable vacuum source or sources (not shown). In particular the vacuum within the hydrogen reduction chamber 14 must be extremely high to maximize the reduction process.

The load lock chamber 12 isolates the hydrogen reduction cheer 14 from the environment during loading of the wafers 18. This increases system performance because the hydrogen reduction chamber 14 does not have to be vented and reconditioned after each run. The load lock chamber 12 may be constructed as a single wafer station or with a casette for loading a plurality of wafers 18 for individual processing.

The transport channels 24, 26, 28 are adapted to move an individual wafer 18 carrier free between the chambers 12, 14, 16 without exposure to ambient. As such, the transport channels 24, 26, 28 my include a holder (not shown) for the wafer 18 which is attached to a movable belt or conveyor apparatus. Suitable controls and indexing apparatus may be provided for automatically loading a wafer into the transport channels 24, 26, 28 for movement though the system 10.

In the ion implant system 10 shown in FIG. 1, the hydrogen reduction chamber 14 is adapted to generate a low pressure ionized hydrogen plasma for performing a hydrogen reduction on the wafer 18. Alternately, the hydrogen reduction chamber 14 may be constructed to deliver a high temperature hydrogen gas instead of a plasma. As another alternative, the hydrogen reduction chamber 14 may be constructed as a chemical treatment or sputter etch station to effect the removal of surface nitrides and other contaminants and to prevent these contaminants form being "knocked on" during the ion implantation process.

The generation of a low temperature-high energy plasma is preferred, however, as it allows the hydrogen reduction process to be performed at relatively low temperatures. This permits high density and high speed semiconductor devices to be manufactured using state of the art materials and process chemistries. The hydrogen plasma may be generated by techniques that are known in the art (i.e. rf field, dc gas discharge, magnetic field enhanced, ECR).

In the illustrative embodiment of the invention, the plasma is generated using a radio frequency (rf) field. As such, the hydrogen reduction chamber 14 includes a grounded holder 30 for the wafer 18, a biased electrode 32 connected to a radio frequency (rf) generator 34, and an inlet 36 coupled to a source of hydrogen. With such an arrangement, a hydrogen plasma 38 can be generated and directed at the surface of the wafer 18. In some cases it is preferred to have the wafer 18 in a floating potential and not biased so that damage induced by the cleaning plasma can be minimized. In this case, a downstream plasma generating system can be employed (not shown).

In general, the hydrogen plasma 38 will contain hydrogen ions. The hydrogen ions will react with contaminants present on the wafer surface. This will reduce the contaminants to volatile hydrides. The volatile hydrides under the influence of the negative pressures will then diffuse or outgas from the wafer surface. Such a hydrogen reduction is effective for removing adsorbed oxygen, carbon, carbon dioxide, sulfur, phosphorus, boron, native oxides and other contaminants from the surface of the wafer 18. In general, any chemical species which forms a volatile hydride under the conditions present in the hydrogen reduction chamber 14 can be removed from the wafer 18 by a hydrogen reduction. In addition, any species which can be desorped or volatized from the wafer surface (particularly $H_2O$) through the action of energy imparted to the species by the plasma may be removed from the substrate.

Hydrogen can be supplied to the hydrogen reduction chamber 14 as pure hydrogen, as a mixture containing hydrogen, or as a gaseous hydrogen compound. Preferably, the hydrogen is mixed with an inert carrier gas such as argon or nitrogen. Suitable hydrogen compounds in addition to $H_2$ include HCl, a hydrocarbon, or HF.

If desired, the walls of the hydrogen reduction chamber 14 can be heated or cooled utilizing a suitable wall heating/cooling system. This permits additional control over the reduction process.

The hydrogen reduction chamber of the invention can be fabricated by modifying a commercially available wafer stripping apparatus. As an example, the hydrogen reduction chamber 14 may include a matrix 102 single wafer stripping chamber manufactured by Matrix Integrated Systems, Inc. of Richmond, Calif. By way of further example, such a hydrogen reduction chamber 14 may be operated under the following process conditions:

| | |
|---|---|
| Time = | 30 seconds |
| Pressure = | 3.3 Torr |
| Gas flow = | 130 sccm $H_e$ |
| | 50 sccm $H_2$ |
| RF frequency = | 13.56 MHZ |

-continued

| | |
|---|---|
| Power = | 550 watts |

Lower pressures are preferred and in a case where the primary target for removal is native oxide of silicon, elevated substrate temperatures (e.g. above 200° C.) or bias is preferred.

After reduction or description of the contaminants from the surface of the wafer 18 in the hydrogen reduction chamber 14, the wafer 18 remains under vacuum or under an inert environment (e.g. an inert gas). The cleaned wafer 18 can thus be ion implanted without being exposed to ambient. This prevents the cleaned wafer surface from being exposed to oxidation and other contaminants. Following the hydrogen reduction, another wafer transport channel 26 as previously described, transports the wafer 18 from the hydrogen reduction chamber 14 to the ion implanter 16.

The ion implanter 16 can be of a substantially conventional construction but modified for interconnection with the hydrogen reduction chamber 14. The construction for the ion implanter 16 shown in FIG. 1 is merely illustrative as other types of ion implanter constructions would also be suitable. In the illustrative embodiment, the ion implanter 16 includes a wafer holder 40 for receiving the wafer 18 from the transport channel 26 and for holding the wafer for implantation. In addition, the ion implanter 16 includes an ion source 42, an analyzing magnet 44, an acceleration tube 46, a focus 48, and a gate plate 50. The ion implanter 16 is in flow communication with a suitable vacuum source such as a turbo molecular pump. This generates a vacuum within the process chamber of the ion implanter 16.

With this arrangement an ion implant beam 52 is focused on the surface of the wafer 18 for implanting a desired dopant (i.e. boron, phosphorus, arsenic) into the crystal lattice structure of the wafer 18. Since the surface of the wafer 18 has been cleaned of substantially all contaminants in the hydrogen reduction process, there is less chance of "knock ons" being implanted into the crystal lattice structure of the wafer 18.

After ion implantation the wafer 18 is transferred from the wafer holder 40 to another transport channel 28. At the transport channel 28, the wafer 18 is discharged from the system 10 for further processing.

Thus the invention provides a suitable method for ion implanting a substrate in which contaminants are removed from the implantation process and the occurrence of "knock ons" is reduced. A process sequence for ion implanting a substrate in accordance with the method of the invention can be summarized as follows.

1. Loading a substrate to be implanted into a vacuum load lock.

2. Transferring the substrate under vacuum to a hydrogen reduction chamber.

3. Performing a hydrogen reduction on the substrate to form volatile hydrides and remove contaminants from the substrate surface. A preferred method of hydrogen reduction is by generating a low pressure low temperature high energy plasma. In addition to forming volatile hydries, some compounds such as H2O are released or outgassed from the substrate by the transfer of energy from the plasma to the compound.

A high energy plasma can be generated using an rf generator or by generating a dc gas discharge. Hydrogen reduction can also be performed using a high temperature hydrogen gas, a hydrogen sputter etch, or a hydrogen chemical etch. Such a hydrogen reduction will remove contaminants and thin oxide layers on the substrate surface and prevent the formation of "knock ons" during the implantation process.

4. Following the hydrogen reduction, transferring the cleaned substrate under vacuum or an inert environment to an ion implantation process chamber. This prevents the subsequent contamination of the cleaned substrate.

5. Ion implanting the cleaned substrate.

Although the method of the invention has been described in terms of an illustrative embodiment, as will be apparent to those skilled in the art, other applications of the inventive concepts disclosed herein are possible. It is intended therefor that the following claims include such alternate embodiments.

What is claimed is:

1. In semiconductor manufacture, an improved method of ion implantation, comprising:
    performing a hydrogen reduction in a process chamber maintained at a vacuum pressure by directing hydrogen gas at the substrate to a remove contaminants and oxide layers present on the substrate in order to prepare the substrate for ion implantation;
    maintaining the substrate under an inert vacuum environment to prevent additional contamination of the substrate; and
    ion implanting the substrate after the contaminants have been removed by the hydrogen reduction so that the formation of "knocks ons" is reduced.

2. The method as claimed in claim 1 and wherein the hydrogen reduction is performed using a hydrogen plasma.

3. The method as claimed in claim 2 and wherein the hydrogen plasma is generated using a radio frequency (rf) generator.

4. The method as claimed in claim 1 and wherein the hydrogen reduction is performed using a hydrogen gas heated to a temperature of over 200° C.

5. In semiconductor manufacture a method of ion implanting a substrate with ion dopants while preventing the formation of "knock ons", comprising:
    loading the substrate in a load lock chamber under a vacuum pressure;
    transporting the substrate to a hydrogen reduction chamber under a vacuum pressure;
    performing a hydrogen reduction within the hydrogen reduction chamber by directing a hydrogen gas at the substrate under a vacuum pressure to form volatile compounds to remove contaminants and oxide layers present on the substrate in order to prepare the substrate for ion implantation;
    maintaining the substrate under a vacuum environment to prevent additional contamination of the substrate;
    transporting the substrate under a vacuum pressure to a process chamber of an ion implanter; and
    ion implanting the substrate with selected dopants in the ion implant process chamber.

6. The method as claimed in claim 5 and wherein the hydrogen gas is heated to a temperature of over 200° C.

7. The method as claimed in claim 5 and wherein the hydrogen gas is a hydrogen plasma.

8. The method as claimed in claim 7 and wherein the hydrogen plasma is a low temperature, high-energy plasma generated using a radio frequency (rf) generator.

9. The method as claimed in claim 8 and wherein a hydrogen source for the hydrogen plasma is $H_2$ mixed with an inert carrier gas.

10. The method as claimed in claim 8 and wherein a hydrogen source for the hydrogen plasma is a gaseous hydrogen compound.

11. The method as claimed in claim 5 and wherein the hydrogen reduction chamber is a sputter etch chamber.

12. The method as claimed in claim 5 and wherein the hydrogen reduction step removes contaminants selected from the group consisting of carbon, carbon dioxide, oxygen, sulfur, phosphorus, boron, $H_2O$, and native oxides.

13. The method as claimed in claim 5 and wherein the method is performed in a closed system with the load lock chamber, the hydrogen reduction chamber and the ion implant process chamber connected by sealed transport channels.

14. In semiconductor manufacture an improved method of ion implantation in which contaminants and thin oxide layers are removed from a semiconductor wafer and the formation of "knocks ons" in a crystal lattice of the wafer is prevented, said method comprising:
 loading a wafer into a vacuum load lock chamber;
 transporting the wafer under vacuum pressure to a hydrogen reduction chamber;
 generating a hydrogen plasma within the hydrogen reduction chamber under vacuum pressure and directing the hydrogen plasma at the wafer to form volatile hydrides and remove contaminants and oxide layers present on the wafer in order to prepare the wafer for ion implantation;
 maintaining the wafer under a vacuum environment to prevent additional contamination of the wafer;
 transporting the wafer under vacuum pressure to a process chamber of an ion implanter; and
 ion implanting the wafer with selected ion dopants.

15. The method as claimed in claim 14 and wherein the hydrogen plasma is generated using a radio frequency (rf) generator and the wafer is held in the hydrogen reduction chamber on a grounded holder.

16. The method as claimed in claim 15 and wherein the method is carried out in a closed system having sealed transport chambers for transporting the wafer between the load lock chamber, the hydrogen reduction chamber and the ion implant process chamber.

17. The method as claimed in claim 16 and wherein a hydrogen source for the hydrogen plasma is $H_2$ combined with an inert carrier gas.

18. The method as claimed in claim 16 and wherein a hydrogen source for the hydrogen plasma is a hydrogen compound.

19. The method as claimed in claim 16 and wherein the hydrogen reduction removes contaminants selected from the group consisting of carbon, carbon dioxide, oxygen, sulfur, phosphorus, boron, $H_2O$ and native oxides.

* * * * *